(12) United States Patent
Campbell

(10) Patent No.: US 7,492,177 B1
(45) Date of Patent: *Feb. 17, 2009

(54) BENDABLE CONDUCTIVE CONNECTOR

(75) Inventor: Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/803,733

(22) Filed: May 14, 2007

Related U.S. Application Data

(63) Continuation of application No. 11/019,325, filed on Dec. 17, 2004, now Pat. No. 7,221,179.

(60) Provisional application No. 60/531,078, filed on Dec. 18, 2003.

(51) Int. Cl.
*G01R 31/02* (2006.01)

(52) U.S. Cl. .................. 324/761; 324/754; 324/762

(58) Field of Classification Search .................. None
See application file for complete search history.

(56) References Cited

U.S. PATENT DOCUMENTS

| 6,191,594 | B1 | 2/2001 | Nightingale et al. |
| 6,292,701 | B1 | 9/2001 | Prass et al. |
| 6,400,167 | B1 | 6/2002 | Gesford et al. |
| 6,404,215 | B1 | 6/2002 | Nightingale et al. |
| 6,603,297 | B1 | 8/2003 | Gesford et al. |
| 6,828,768 | B2 | 12/2004 | McTigue |
| 7,221,179 | B1 * | 5/2007 | Campbell .................. 324/761 |
| 2002/0052155 | A1 * | 5/2002 | Campbell et al. ........... 439/824 |
| 2004/0207417 | A1 | 10/2004 | Barr |

OTHER PUBLICATIONS

AP033/34—Recomended Accessory Diagram, at least as early as Nov. 7, 2004, 1 page.
Product Specs for Tektronix P6243, from Tucker Electronics web page (www.tucker.com), at least as early as Nov. 7, 2004, 2 pages.
"Differential Probes AP034 AP033"; "LeCroy Oscilloscopes, Protocol Analyzers, and Serial Data Test Solutions 2005/2006 Catalog"; at least as early as Nov. 2005; pages cover, H-18, H-19, and back page; www.lecroy.com.
"Tektronix 016 1885 00"; Test Path Test Accessories web page (http://www.testpath.com/Product.aspx?pn=118-742); at least as early as Jul. 18, 2006; 1 page; www.testpath.com.
"Pogo Pin Repalcement Instructions ICM P/N:P6132298 (For TDR Probes with Spring Loaded Ground Contacts"; http://www.icmicrowave.com/TDR_Probes/B6132298_pogo_pin_instr.pdf; at least as early as Jul. 2006; 4 pages, Inter-Continental Microwave.

\* cited by examiner

*Primary Examiner*—Minh N Tang
(74) *Attorney, Agent, or Firm*—Law Office of Karen Dana Oster, LLC

(57) ABSTRACT

A conductive connector includes a bendable, shape retainable extension having a first end and a second end. The first end is integral with the probing head. The test point connector is integral with said second end. The test point connector is for making electrical contact with testing points. The present invention may be part of a probing system. The present invention may also include a method for using the conductive connector.

15 Claims, 5 Drawing Sheets

BENDABLE CONDUCTIVE CONNECTOR

The present application is a continuation of U.S. patent application Ser. No. 11/019,325, filed Dec. 17, 2004, now U.S. Pat. No. 7,221,179. U.S. patent application Ser. No. 11/019,325 is an application claiming the benefit under 35 USC Section 119(e) of U.S. Provisional Patent Application Ser. No. 60/531,078, filed Dec. 18, 2003. The present application is based on and claims priority from these applications, the disclosures of which are hereby expressly incorporated herein by reference.

BACKGROUND OF INVENTION

The present invention relates to an electrical test probe tip ("probing tip"), and more particularly to a bendable conductive connector.

FIGS. 1 and 2 show a probing system that includes an electrical test probe 20 for providing an electrical connection between electrical components 22 and testing instruments 24. An electrical test probe 20 generally consists of a cable 32 having a probing head 30 at one end and a testing instrument connector 34 at the other end for attaching the cable to testing instruments 24 (e.g. oscilloscopes and other measuring, monitoring, diagnostic, and signal processing instruments). The probing head 30 generally is interconnectable with at least one probing tip, which may be a removable and/or replaceable probing tip 40. A socket 38 or other connection means may be used for connecting the probing tip 40 to the probing head 30. One or more of the probing tips 40 may be used, for example, for making electrical contact with testing points 22 (e.g. pins, leads, paths, or other electrical components) such as those found on a circuit board. One or more of the probing tips 40 may be used as a means for connecting the probing head 30 to ground. Ground provides the electrical reference point for other signal measurements, so the ground connection typically remains unchanged while the probing head is positioned at testing points so that the electrical signal thereon may be measured, monitored, or otherwise processed.

It is difficult to form a contact with modern miniaturized testing points. For example, both the pins and the spacing between the pins on a modern integrated circuit chip ("IC") have been miniaturized. If two adjacent pins are contacted simultaneously by the probing tip, a short circuit may result between the two adjacent pins. A short circuit may prevent measurement of the desired signal and may result in damage to the internal circuitry of the IC.

Most probing tips are stiff. For example, a traditional probing tip is a stiff conductive member that terminates in a conical, blunt, or rounded point. IC grabber probes have a jaw-like tip that connects to and holds a pin, but are also relatively stiff and prevent optimum positioning of probing heads.

Tektronix, Inc. produces a signal-ground adapter that has been specifically designed to connect with a square pin. But like the IC grabber probes, the signal-ground adapter connects rigidly to signal and ground pins, and the inflexibility prevents desirable movement of the probing head to optimum positions. Tektronix also produces a right-angle adapter that includes a stiff coil used to rigidly attach a probe at a right angle to a pin. The purpose of the stiff coil is to mate with a pin, and the stiffness prevents movement of the probe. Because it is inflexible after mating with the pin, the coil is not adaptable and may be used in only one position for probing a specific type of pin (a 0.025 inch diameter square pin). Tektronix also produces a "Y-lead" adapter that has wire leads that may be combined with the right-angle adapter. The combination of the right-angle adapter and the Y-lead adapter may allow the probing head to be moved relative to the device being probed, but the addition of leads may add inductance. Probing an electrical device using the Y-lead adapter may be inconvenient or impossible using just one hand. Typically, the probe body must be laid on the table while pin connections are changed. Draping the wire leads on electrical components and moving parts, such as a CPU fan, is another disadvantage of the Y-lead adapter.

Several prior art references are directed to electrical test probe tips and electrical connectors. U.S. Pat. No. 4,978,312 to Fodali (the "Fodali reference") is directed to a tip attachment for a circuit test probe and, specifically, to a spring attachment for placement on a handheld tester with an ice pick-type probe. One end of the tapered spring tip attachment fits on the ice pick-type probe, and the other end terminates in a straight length of wire. The purpose of this spring attachment is to provide a smaller gauge tip for insertion into sockets too small for the ice pick probe. In other words, the Fodali tip uses a spring merely as a connector for attaching the straight wire probe end to a tapered ice pick-type probe.

U.S. Pat. No. 3,885,848 to Brouneus (the "Brouneus reference") is directed to a method of making an electrical connection with a flat surface contact using a conical spring. The contact member is a conically spiraled length of electrically conductive resilient wire including spirals that progressively increase in size. A cylindrical helix is electrically connected to the small end of the volute helix. An electrically conductive terminal member may be inserted into and secured within the cylindrical helix. The wide end of the conical spring may be electrically connected to a flat conductive surface. Compressing the volute helix moves the spirals of the helix into contact with a flat surface. The volute helix would return to its original position if not held in place.

Problems with exemplary ground connections include, but are not limited to, that they do not hold themselves in place, they are not able to be used in an axial application, they have poor compliance, they have poor or little radial adjustment, they have poor axial compliance, and they are not adjustable or are only adjustable in one direction.

BRIEF SUMMARY OF THE INVENTION

One preferred embodiment of the conductive connector of the present invention includes a bendable, shape retainable extension having a first end and a second end. A head connector is integral with the first end and a test point connector is integral with the second end. The head connector is for connecting the conductive connector to a probing head. The test point connector is for making electrical contact with testing points. The present invention may be part of a probing system that includes a probing head. The present invention may also include a method for using the conductive connector.

Another preferred embodiment of the conductive connector of the present invention includes a bendable, shape retainable extension having a first end and a second end. The first end is integral with the probing head. The test point connector is integral with said second end. The test point connector is for making electrical contact with testing points. The present invention may be part of a probing system. The present invention may also include a method for using the conductive connector.

The foregoing and other objectives, features, and advantages of the invention will be more readily understood upon

DETAILED DESCRIPTION OF THE INVENTION

Figure 1:
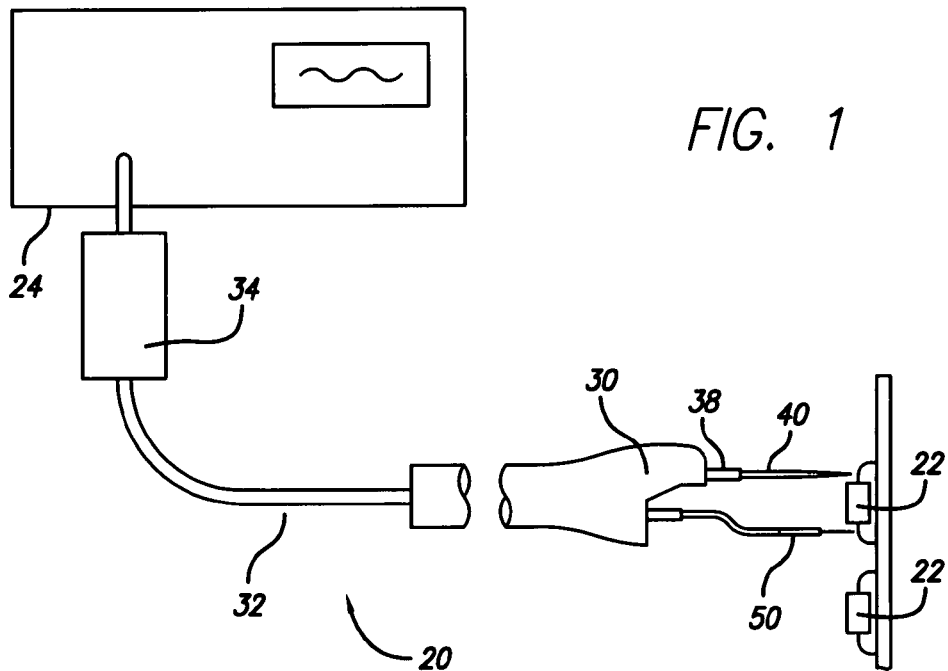
FIG. 1 is a schematic diagram of a first exemplary probing system in which the bendable conductive connector of the present invention may be used, the test point connector of the bendable conductive connector being in an extended position.
Figure 2:
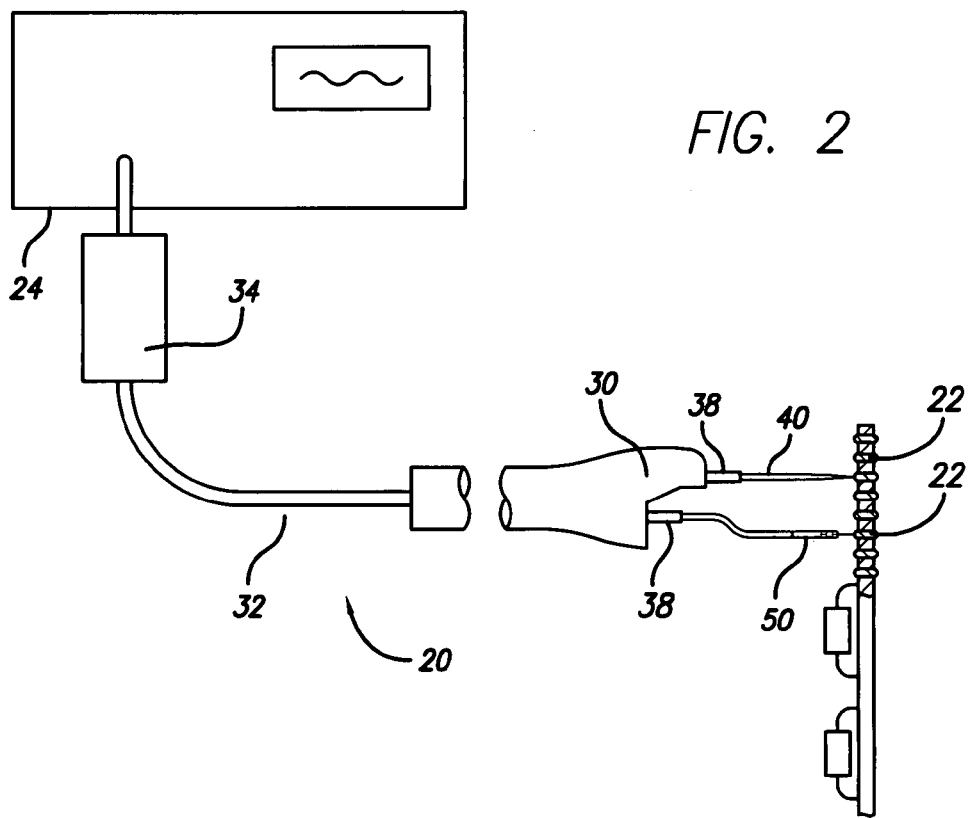
FIG. 2 is a schematic diagram of a second exemplary probing system in which the bendable conductive connector of the present invention may be used, the test point connector of the bendable conductive connector being in a retracted position.
Figure 3:
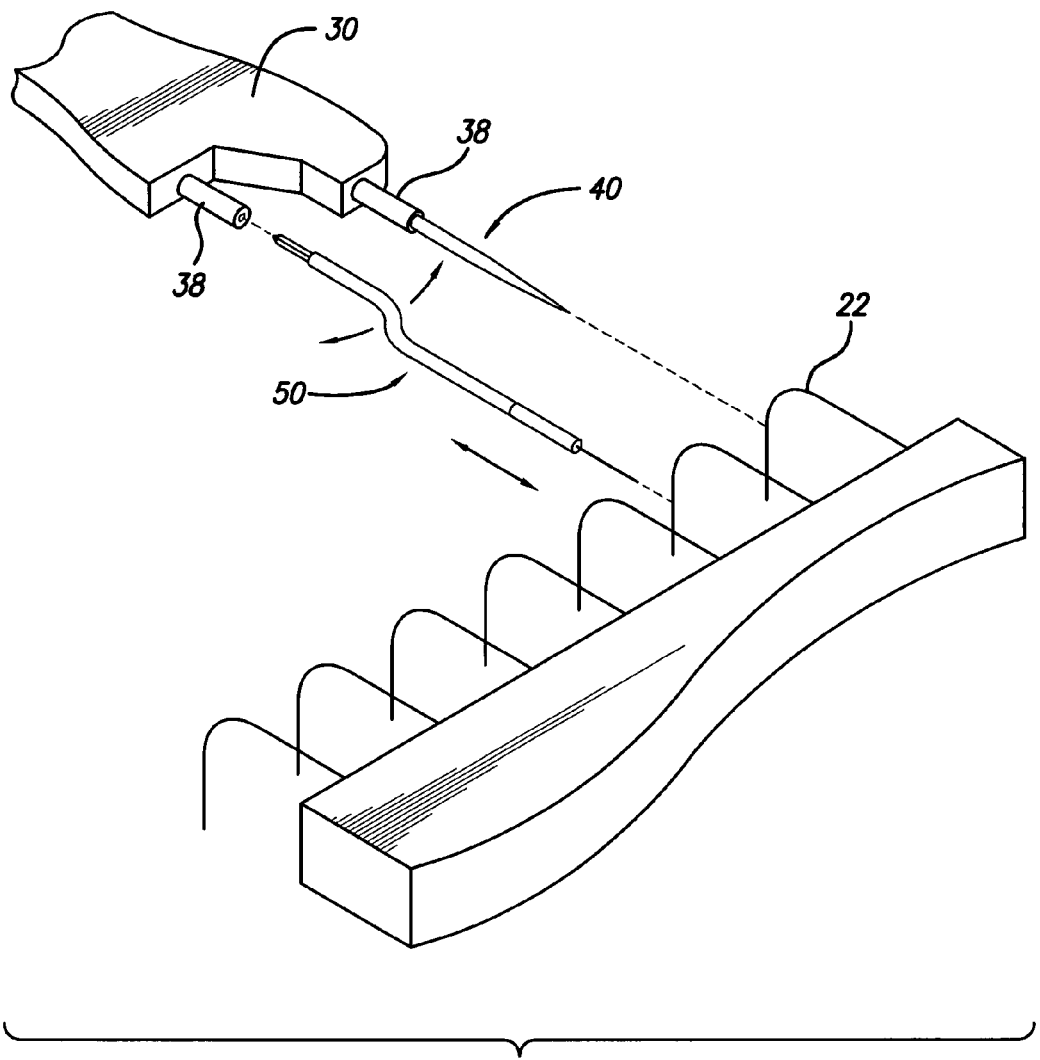
FIG. 3 is a perspective view of a bendable conductive connector that is interconnectable at one end with a probe head and at the opposite end with an electrical component.
Figure 7:
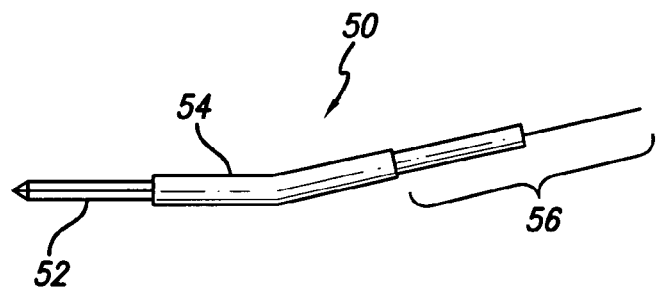
FIG. 7 is a top plan view of a short embodiment of a bendable conductive connector with a single bend therein.
Figure 8:
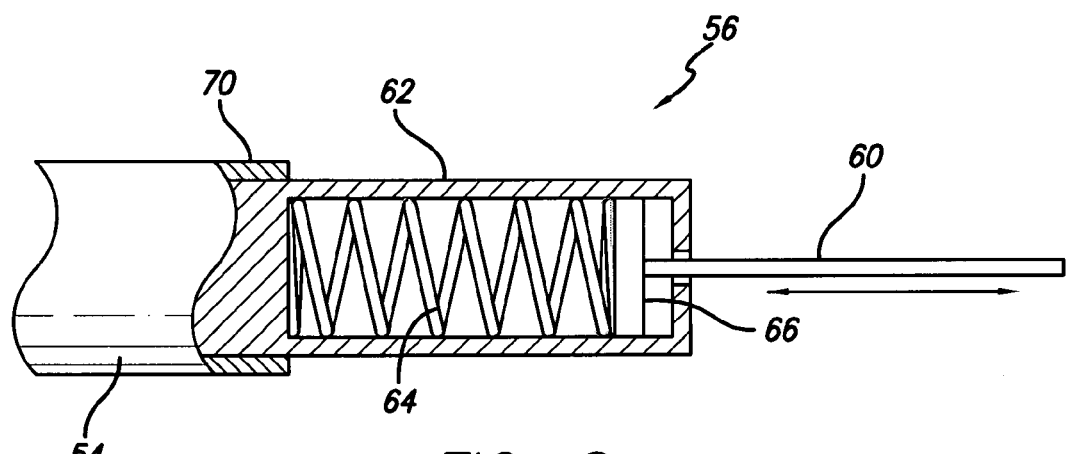
FIG. 8 is a cross-sectional view of the test point connector taken along lines 8'-8' of FIG. 6.
Figure 9:
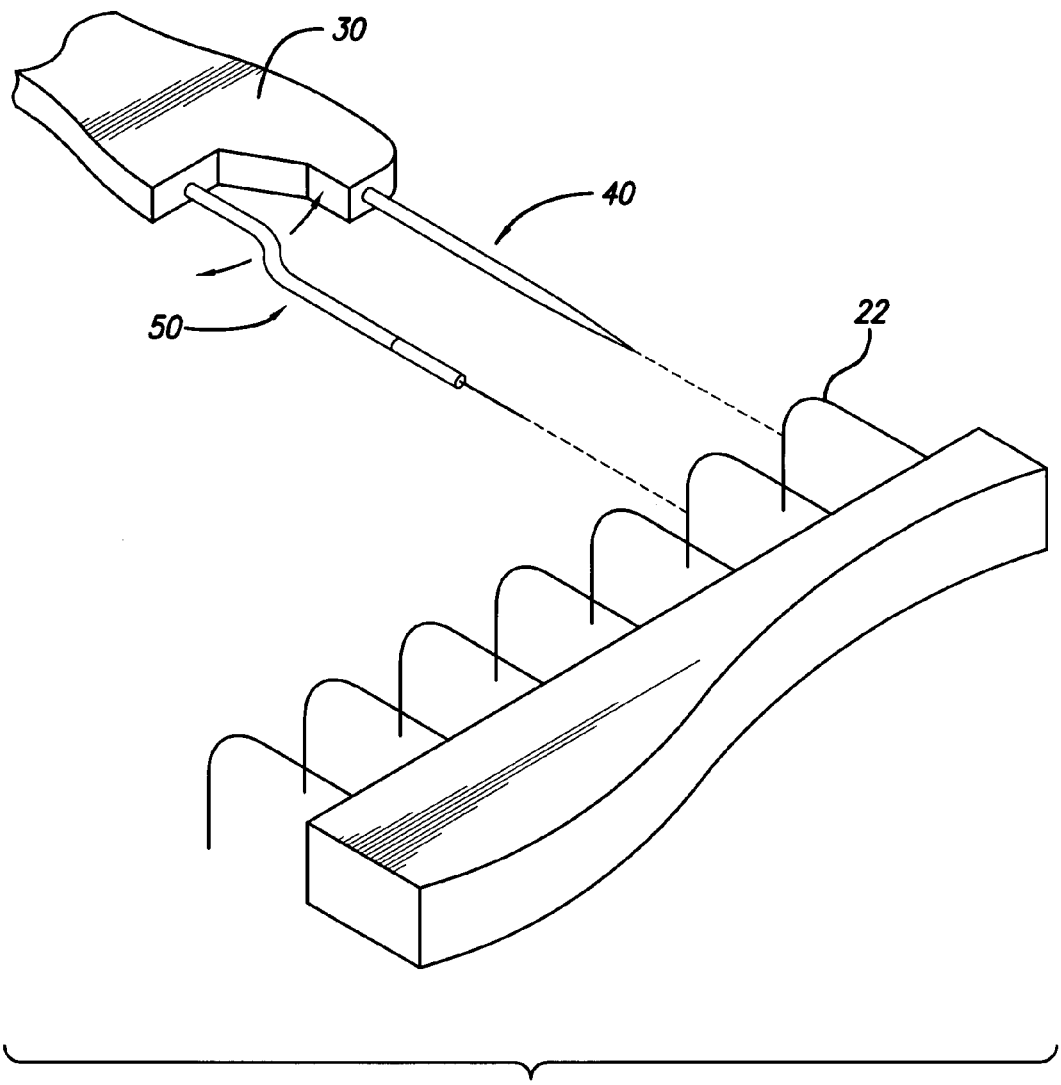
FIG. 9 is a perspective view of a bendable conductive connector that is integral at one end with a probe head and interconnectable at the opposite end with an electrical component.

As shown in FIGS. 1 and 2 the present invention may be implemented as part of a probing system that includes an electrical test probe 20 for providing an electrical connection between electrical components 22 (or ground, hereinafter jointly referred to as "testing points 22") and testing instruments 24. An electrical test probe 20 generally consists of a probing head 30, a cable 32, and a testing instrument connector 34. The probing head 30 may have an integral or replaceable bendable conductive connector probe tip 50 that is suitable for making an electrical contact with electrical components 22. FIGS. 1-8 show a replaceable configuration and FIG. 9 shows an integral configuration.

One or more bendable conductive connector 50 may be used, for example, for making electrical contact with testing points 22. One or more bendable conductive connector 50 may be used as a means for connecting the probing head 30 to a ground testing point. Ground provides the electrical reference point for other signal measurements, so the ground connection typically remains unchanged while the probing head 30 is positioned at testing points 22 so that the electrical signal thereon may be measured, monitored, or otherwise processed.

Customers need innovative adjustable spring loaded ground connectors such as the bendable conductive connector 50 of the present invention to hold ground leads in place. One advantage of the bendable conductive connector 50 of the present invention is that it is able to "snake" around objects.

One preferred embodiment of the bendable conductive connector 50 of the present invention includes a three-part bendable conductive connector 50: a head connector 52, a bendable extension 54, and a test point connector 56.

If the bendable conductive connector probe tip 50 is replaceable, generally the probing head 30 will have a socket 38 or other connection mechanism for mating with the bendable conductive connector 50. The head connector 52, as shown, may be for example a square pin or other connection mechanism compatible with the socket 38 or other connection mechanism of a probing head 30 of an electrical test probe 20. As shown in FIG. 9, it should be noted that if the bendable conductive connector 50 were integral with the probing head 30, neither the head connector 52 nor the socket 38 (or other connection mechanism) would be necessary.

The bendable extension 54 may be any conductive material that is bendable and shape retainable. For purposes of this invention, the bendable extension 54 is not "floppy" in that it is able to hold its shape once it is shaped in the proper position and shape. For purposes of this invention, the bendable extension 54 is not flexible (which, for purposes of this invention can be defined as being able to change shapes, but snapping back or otherwise returning to its original shape rather than holding the new shape). For purposes of this invention, the bendable extension 54 is not truly stiff in that it is able to change shape relatively easily (e.g. without the use of tools or substantial force). The bendable extension 54 may optionally include an insulating jacket 70 (FIG. 8).

The test point connector 56 is generally for making electrical contact with testing points 22. The test point connector 56, is shown as, for example, a spring loaded pogo pin. A pogo pin is a kind of spring-loaded pin formed of an inner member 60 (shown as a pin) and an outer member 62 joined together with an internal spring 64. In one preferred embodiment a contactor 66 is formed on the end of the inner member 60. A pogo pin is generally used to contact pads on a circuit board. FIG. 1 shows the test point connector 56 (not labeled) being in an extended position. FIG. 2 shows the test point connector 56 (not labeled) being in a retracted position.

Figure 4:
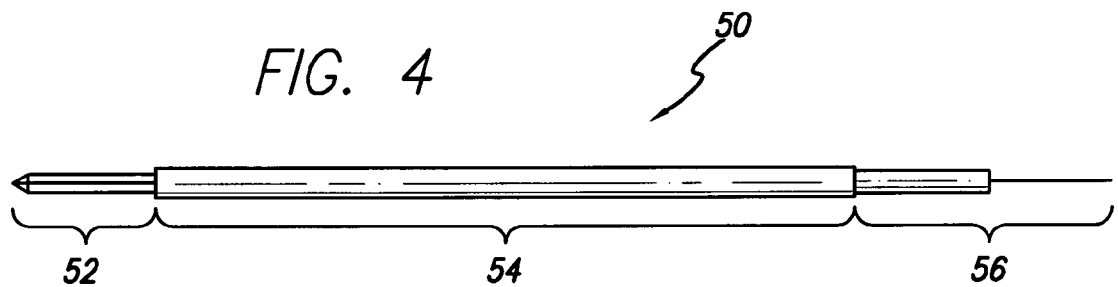
FIG. 4 is a top plan view of a bendable conductive connector in a straight shape.
Figure 5:
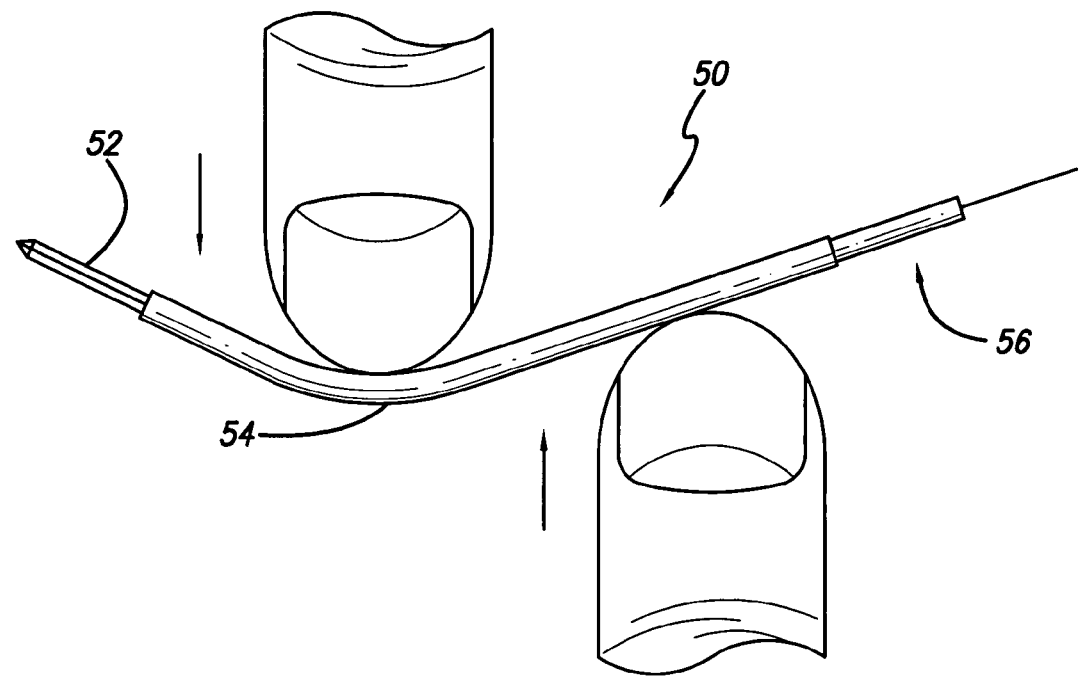
FIG. 5 is a top plan view of a bendable conductive connector in the process of being bent by hand.
Figure 6:
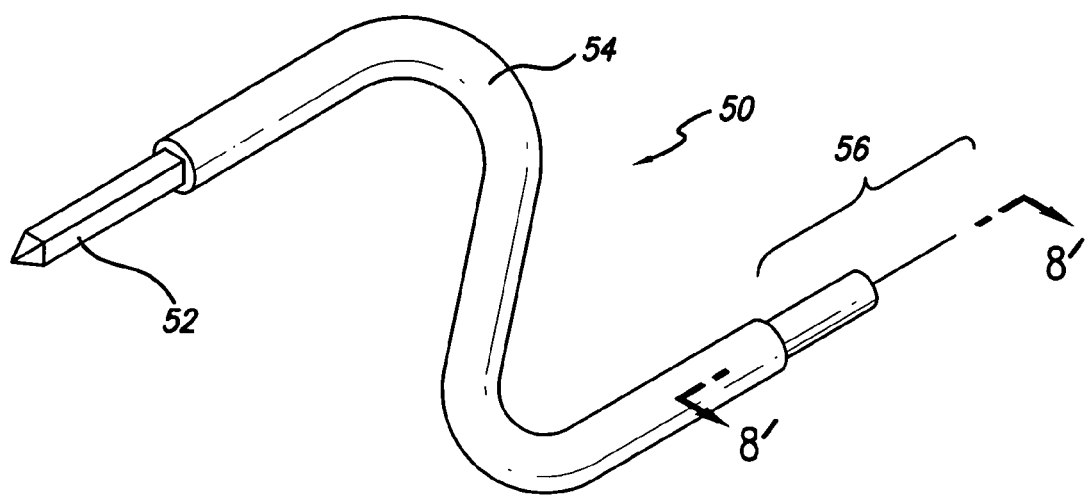
FIG. 6 is a top plan view of a long embodiment of a bendable conductive connector with two bends therein.

The present invention also includes a method for using the bendable conductive connector 50. The first step of the method is to provide a bendable conductive connector 50 that has a bendable extension 54, a head connector 52, and a test point connector 56. The bendable extension 54 has a first end and a second end. The head connector 52 is preferably integral with the first end of the bendable extension 54. The test point connector 56 is preferably integral with the second end of the bendable extension 54. FIG. 4 shows an exemplary bendable conductive connector in a straight shape. Next, as shown in FIG. 5, a user bends the bendable extension 54 into a desired shape or configuration. Preferably, the bendable extension 54 is hand bendable such that no special tools are required for bending it. As the bendable extension 54 is bendable and shape retainable, the bendable extension 54 holds its shape after it is bent. FIG. 6 shows a long embodiment of the bendable conductive connector with two bends therein. FIG. 7 shows a short embodiment of the bendable conductive connector with a single bend therein. If the bendable conductive connector is a replaceable embodiment, the head connector 52 may then be inserted into a socket 38 of a probing head 30. Finally, the test point connector 56 may be used to probe at least one testing point 22. It should be noted that the term "testing point" can include ground.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A conductive connector comprising:
   (a) a bendable extension able to hold its shape once it is shaped in a proper position and shape, said bendable extension having a first end and a second end;
   (b) a probing head integral with said first end; and
   (c) a test point connector integral with said second end.

2. The conductive connector of claim 1 wherein said bendable extension is shape retainable.

3. The conductive connector of claim 1 wherein said probing head is a probing head of an electrical test probe.

4. The conductive connector of claim 1 wherein said test point connector is a spring loaded pogo pin.

5. The conductive connector of claim 1 wherein said conductive connector is a ground conductive connector of said probing head.

6. The conductive connector of claim 1 wherein said bendable extension is not truly stiff in that it is able to change shape relatively easily.

7. A probing system comprising:
   (a) a conductive connector comprising:
      (i) a bendable, shape retainable extension able to hold its shape once it is shaped in a proper position and shape, said bendable, shape retainable extension having a first end and a second end; and
      (ii) a test point connector integral with said second end; and
   (b) a probing head of an electrical test probe, said probing head integral with said first end.

8. The probing system of claim 7 wherein said test point connector is a spring loaded pogo pin.

9. The probing system of claim 7 wherein said conductive connector is a ground conductive connector of said probing head.

10. The probing system of claim 7 wherein said bendable, shape retainable extension is not truly stiff in that it is able to change shape relatively easily.

11. A method for using a conductive connector, said method comprising the steps of:
    (a) providing a probing head;
    (b) providing a conductive connector comprising:
       (i) a bendable, shape retainable extension able to hold its shape once it is shaped in a proper position and shape, said bendable, shape retainable extension having a first end and a second end;
       (ii) said probing head integral with said first end; and
       (iii) a test point connector integral with said second end;
    (c) bending said bendable, shape retainable extension into a desired configuration; and
    (d) using said test point connector, probing at least one testing point.

12. The method of claim 11 wherein said bendable, shape retainable extension is not truly stiff in that it is able to change shape relatively easily.

13. The method of claim 11 wherein said test point connector is a spring loaded pogo pin.

14. The method of claim 11 wherein said probing head is a probing head of an electrical test probe.

15. The method of claim 11 further comprising the step of probing at least one ground testing point.

* * * * *